(12) United States Patent
Safar et al.

(10) Patent No.: US 9,559,225 B2
(45) Date of Patent: Jan. 31, 2017

(54) SOLID STATE DETECTION DEVICES, METHODS OF MAKING AND METHODS OF USING

(71) Applicant: LGS Innovations LLC, Herndon, VA (US)

(72) Inventors: Hugo F Safar, Westfield, NJ (US); Paul Bollond, Hamilton, NJ (US); Brijesh Vyas, Warren, NJ (US)

(73) Assignee: LGS INNOVATIONS LLC, Herndon, VA (US)

( * ) Notice: Subject to any disclaimer, the term of this patent is extended or adjusted under 35 U.S.C. 154(b) by 70 days.

(21) Appl. No.: 14/449,004

(22) Filed: Jul. 31, 2014

(65) Prior Publication Data
US 2016/0035913 A1    Feb. 4, 2016

(51) Int. Cl.
| | |
|---|---|
| G01T 3/08 | (2006.01) |
| H01L 31/0232 | (2014.01) |
| H01L 31/117 | (2006.01) |
| H01L 31/18 | (2006.01) |
| H01L 31/028 | (2006.01) |
| H01L 31/0304 | (2006.01) |

(52) U.S. Cl.
CPC .......... *H01L 31/02325* (2013.01); *G01T 3/08* (2013.01); *H01L 31/028* (2013.01); *H01L 31/0284* (2013.01); *H01L 31/0304* (2013.01); *H01L 31/117* (2013.01); *H01L 31/1804* (2013.01); *H01L 31/1808* (2013.01); *H01L 31/1828* (2013.01); *Y02P 70/521* (2015.11)

(58) Field of Classification Search
CPC ....................................................... G01T 3/08
See application file for complete search history.

(56) References Cited

U.S. PATENT DOCUMENTS

| | | | |
|---|---|---|---|
| 9,121,947 B2* | 9/2015 | Nikolic et al. | |
| 2007/0132351 A1* | 6/2007 | Downing et al. | ......... 313/103 R |
| 2012/0235260 A1* | 9/2012 | Nikolic et al. | ................ 257/429 |

* cited by examiner

*Primary Examiner* — David Porta
*Assistant Examiner* — Hugh H Maupin
(74) *Attorney, Agent, or Firm* — Baker and Hostetler LLP (57) ABSTRACT

The present application is directed to a solid state device for detecting neutrons. The device includes a semiconductor substrate having pores. The device also includes a p- or n-type doping layer formed on a surface of the pores. Moreover, a layer of fill material is formed on the p- or n-type doping layer. The present application also is directed to a method of making a solid state device. Further, the present application is directed to a method of detecting efficiency of solid state detector devices.

20 Claims, 6 Drawing Sheets

Step 1
610 — Providing a solid state detector device including a porous substrate with a p- or n-type doping layer formed on a surface of the substrate pores and a layer of fill material formed on a surface of the p- or n-type doping layer.

Step 2
620 — Receiving incoming neutron particles from a beam at the fill material of the solid state detector device.

Step 3
630 — Receiving charged particles through the surface of the substrate pores with the p- or n-type doping layer formed thereon based upon a reaction of the incoming neutron particles and ions of the fill material.

Step 4
640 — Measuring a detection efficiency based upon a fraction of the received charged particles at the pores and all received neutrons at the fill material.

FIG. 6

SOLID STATE DETECTION DEVICES, METHODS OF MAKING AND METHODS OF USING

BACKGROUND

1. Field of the Disclosure

The invention generally relates to solid state devices for detecting neutrons. More particularly, this invention relates to solid state devices with improved efficiency at detecting neutrons.

2. Related Art

Neutron detectors may be used in a variety of applications for ensuring the safety of the general public. Conventional neutron detectors employ pressurized tubes containing Helium-3 gas. These detectors are bulky and expensive to manufacture. Thus, their implementation in applications requiring compact and sensitive devices with low power consumption has been reduced.

More recently, solid state neutron devices made of Silicon diodes have been employed. Namely, holes are etched in the Silicon diode by a process known as Reaction Ion Etching (RIE). A fill material used to capture neutrons is deposited in the etched holes via a vapor process. However, the process to etch the silicon substrate via RIE requires the use of expensive etching equipment. Moreover, the equipment is difficult to operate and thus leads to increased processing time.

Separately, the RIE technique limits the diameter of holes and maximum density of holes etched in the Silicon diode. Moreover the vapor phase deposition technique tends to clog the holes/pores in the Silicon diodes. As such, a complete filling of absorbable material cannot be achieved. Accordingly the sensitivity of the detector is greatly diminished.

A need exists in the art for a compact, low-cost solid state neutron detector device.

Another need exists in the art for a solid state neutron device that is easy and inexpensive to manufacture.

Yet another need exists in the art for a solid state device having an increased efficiency for detecting neutrons.

SUMMARY

The foregoing needs are met, to a great extent, by the invention, with a process, apparatus and system for detecting neutron efficiency of a solid state neutron device.

One aspect of the invention is directed to a method for making a solid state device for detecting neutrons. The method includes a step of providing a bulk semiconductor substrate. The method also includes the step of electrochemically processing the substrate in an organic bath for a predetermined time period to form pores in the substrate. The method further includes the step of filling the pores with a fill material. According to an embodiment, the method further includes the step of doping a surface of the pores via gaseous diffusion with a p- or n-type impurity prior to the filling step.

Another aspect of the invention is directed to a solid state neutron detection device. The device includes a semiconductor substrate having pores. Moreover, the device includes a p- or n-type doping layer formed on a surface of the pores. Further, the device includes a layer of fill material formed on the p- or n-type doping layer. The device exhibits a neutron detection efficiency greater than about 40%. In an embodiment, the height of the substrate pores is about 10-50 microns. In another embodiment, the diameter of the pores is about 0.1-2 microns. In yet another embodiment, a pore density of the substrate is about 1-10 pores per square micron. In yet even a further embodiment, the thickness of the doping layer is about 0.05-0.5 microns.

Yet another aspect of the invention is directed to a method of detecting efficiency of a solid state detector device. The method includes the step of providing the solid state detector device including a porous substrate with a p- or n-type doping layer formed on a surface of the substrate pores. Moreover, a layer of fill material is formed on a surface of the p- or n-type doping layer. The method also includes the step of receiving incoming neutron particles from a beam at the fill material of the solid state detector device. The method further includes a step of receiving charged particles through the surface of the substrate pores with the p- or n-type doping layer formed thereon based upon a reaction of the incoming neutron particles and ions of the fill material. The method also includes the step of measuring a detection efficiency based upon a fraction of the received charged particles at the pores and all received neutrons at the fill material. According to an embodiment, the detector efficiency is greater than about 40%. In another embodiment, the detector efficiency of the device is greater than about 40% and less than about 70%.

There has thus been outlined, rather broadly, certain aspects of the invention in order that the detailed description thereof herein may be better understood, and in order that the present contribution to the art may be better appreciated. There are, of course, additional aspects of the invention that will be described below and which will form the subject matter of the claims appended hereto.

In this respect, before explaining at least one aspect of the invention in detail, it is to be understood that the invention is not limited in its application to the details of construction and to the arrangements of the components set forth in the following description or illustrated in the drawings. The invention is capable of aspects or aspects in addition to those described and of being practiced and carried out in various ways. Also, it is to be understood that the phraseology and terminology employed herein, as well as the abstract, are for the purpose of description and should not be regarded as limiting.

Reference in this application to "one aspect," "an aspect," "one or more aspects," "an aspect" or the like means that a particular feature, structure, or characteristic described in connection with the aspect is included in at least one aspect of the disclosure. The appearances of, for example, the phrases "an aspect" in various places in the specification are not necessarily all referring to the same aspect, nor are separate or alternative aspects mutually exclusive of other aspects. Moreover, various features are described which may be exhibited by some aspects and not by the other. Similarly, various requirements are described which may be requirements for some aspects but not by other aspects.

As such, those skilled in the art will appreciate that the conception upon which this disclosure is based may readily be utilized as a basis for the designing of other structures, methods and systems for carrying out the several purposes of the invention. It is important, therefore, that the claims be regarded as including such equivalent constructions insofar as they do not depart from the spirit and scope of the invention.

BRIEF DESCRIPTION OF THE DRAWINGS

In order to facilitate a fuller understanding of the invention, reference is now made to the accompanying drawings, in which like elements are referenced with like numerals.

These drawings should not be construed as limiting the invention and intended only to be illustrative.

DETAILED DESCRIPTION

According to an aspect of the application, there is described a solid state device for detecting neutrons. According to the present application, the solid state device for detecting neutrons may be employed in a plurality of applications. For example, the device may be utilized in specific applications, including but not limited to, inspecting cargo for neutron radiation, monitoring disarmament activities, transporting nuclear materials, and detecting nuclear reactor fuel storage. The solid state device may also be employed in wearable technology worn by personnel to detect neutrons. Separately, the solid state device may also be used in medical diagnostic applications, such as for example, neutron tomography.

Figure 1:
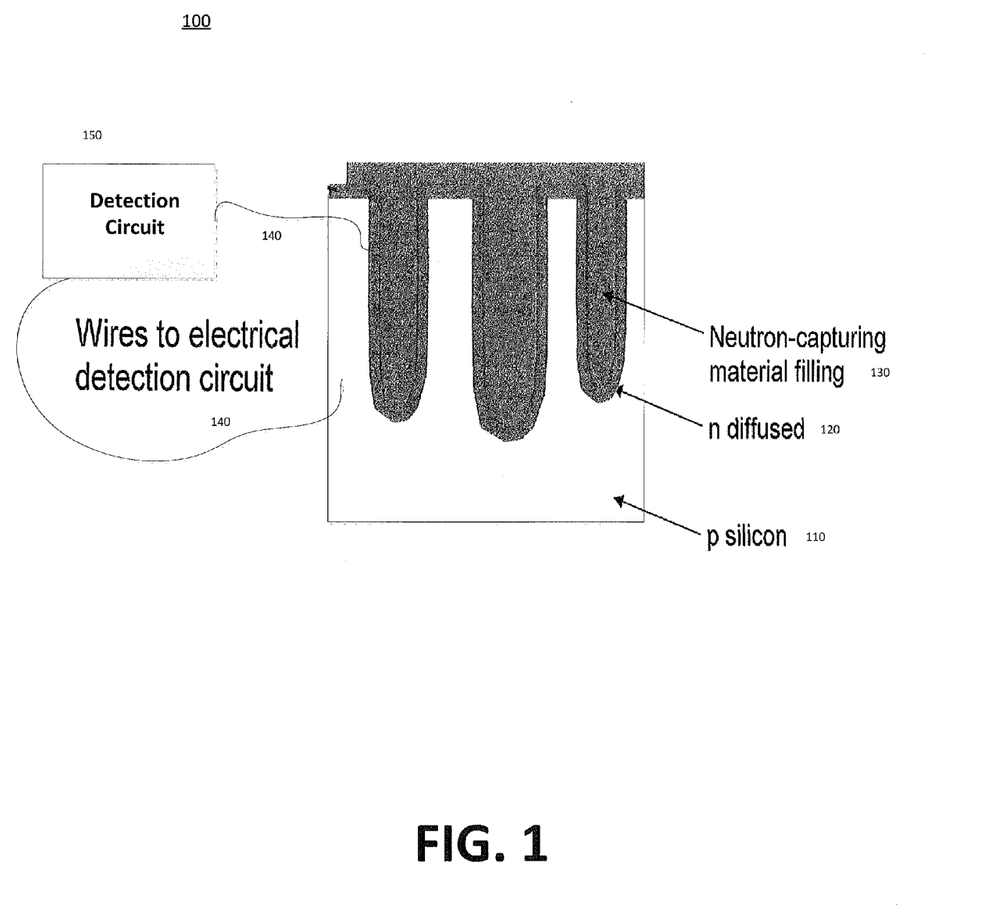
FIG. 1 illustrates a solid state device for detecting neutrons according to the present application.

In one embodiment, as illustrated in FIG. 1, a solid state device 100 for detecting neutrons is described. The device 100 includes a substrate 110. The substrate may be a semiconductor substrate of either p- or n-type. Alternatively, the substrate 110 may include a thin layer of a semiconductor thereon. The substrate 110 may be a bulk semiconductor. As shown in FIG. 1, the substrate 110 is p-type silicon. However, the substrate may also be made from Geranium, Gallium, Arsenide and combinations thereof. The thickness of the substrate 110 ranges from about 100 to 1,000 microns. In a preferred embodiment, the thickness of the substrate ranges from about 500 to 800 microns.

The substrate 110 preferably is porous. According to another embodiment, the porous substrate 110 is formed via an electrochemical processing technique. Namely, the substrate 110 is treated in an electrochemical bath apparatus 200 as illustrated, for example, in FIG. 2. Generally, one or more substrates 110 may be placed in the bath apparatus 200 containing a treating solution 210 for a predetermined period of time. Generally, the time may preferably range from about 15 to 45 minutes. The treating solution 210 will be discussed in more detail below.

Figure 2:
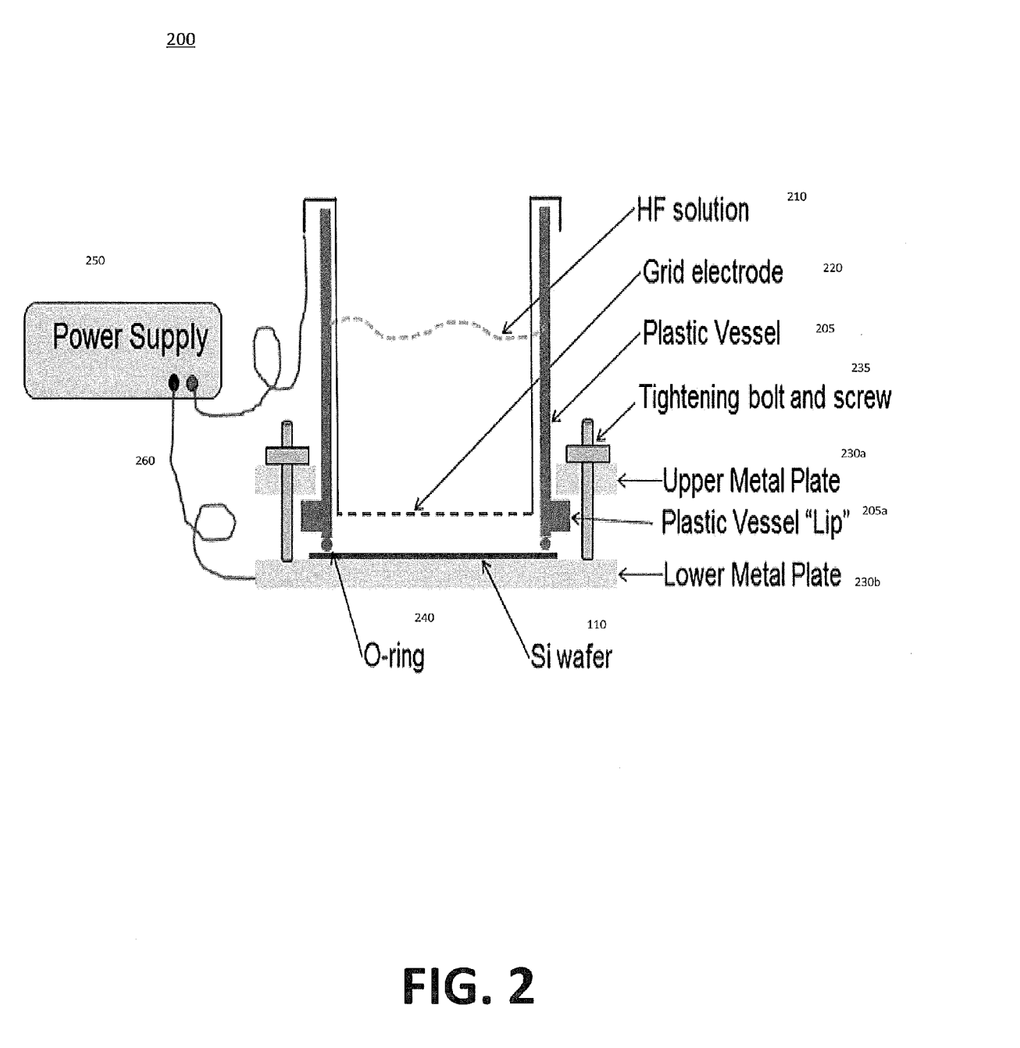
FIG. 2 illustrates an electrochemical processing technique according to an embodiment of the present application.

As shown in FIG. 2, the bath 210 includes a vessel 205. In one embodiment, as shown in FIG. 2, the vessel is made of plastic. It is envisaged to a person of ordinary skill in the art that the vessel may be made of any material including but not limited to metals, and non-metals. Moreover, the vessel 205 may be formed to be any shape as desired. Preferably, the vessel 205 is configured such that it may accommodate one or more substrates 110.

In an embodiment, the vessel 205 may be filled with a predetermined amount of an organic solution 210. The organic solution may be, for example, 20% Hydrofluoric acid (HF) solution. While a 20% HF solution may be employed in this example, it is envisaged that the organic solution 220 may be made of any chemical solution and/or concentration amount so as to produce a substrate with specific pore characteristics as will be discussed below in more detail. One solvent that may be used is dimethylformamide (DMF). Another solvent that may be used is ethanol. The amount of solution 210 employed in the vessel 205 should be sufficient in order to entirely encapsulate the one or more substrates 110.

Moreover, the apparatus 200 may also include a grid electrode 220. The grid electrode 220 may be formed of any metal. For example, the metal may include but is not limited to platinum, gold, silver and combinations thereof. These metals preferably are not corroded by HF. Preferably, the grid electrode is a metal mesh. In one embodiment, the metal mesh includes one or more wires that are employed to support the electrode 220 from the top edge of the vessel 205. One end of the grid electrode 220 may be located inside the vessel 205 in contact with the organic solution 210. Another end of the grid electrode 220 is connected to a power supply 250 via wires 260.

During fabrication of the porous silicon wafer, the power supply delivers an electrical current sufficient to sustain an electrochemical reaction. As the reaction occurs over the surface of the silicon wafer that exposed to the solution, the power supply is generally measured in terms of current density, e.g., current divided by exposed area. The current density in this application may range from about 0.5 to 3 mA/cm$^2$. In an exemplary embodiment, the current density ranges from about 1 to 2 mA/cm$^2$.

The apparatus 200 may also include a device upon which the substrate 110 is held. As shown in FIG. 2, the substrate 110 is oriented between a lower plate 230$b$ and an upper metal plate 230$a$. In one embodiment, the upper and/or lower plates 230$a/b$ may be formed of metal. In another embodiment, the lower metal plate 230$b$ is connected to a power source 250. As illustrated, a surface of the substrate 110 rests upon an upper surface of the lower plate 230$a$. One or more tightening bolt and screw combinations 235 extends through at least one of the upper and/or lower plates 230$a/b$ in order to secure the substrate 110 for processing. In an exemplary embodiment, four bolt and screw combination 235 are employed.

In order to further ensure that the substrate 110 is securely held, a lip 205$a$ of the vessel 205 which outwardly extends from a longitudinal axis thereof is employed. The lip 205$a$ is pushed down, preferably by the upper metal plate 230$a$, in order for the vessel 205 to hold the substrate 110 against the lower metal plate 230$b$. Moreover, an o-ring or other equivalent sealing device 240 may be utilized to ensure a hermetic seal is formed. By so doing, the treating solution 210 can be assured not to leak. Preferably, as shown in FIG. 2, the o-ring 240 may be located between an upper surface of the substrate 110 and the upper plate 230$a$.

Figure 3:
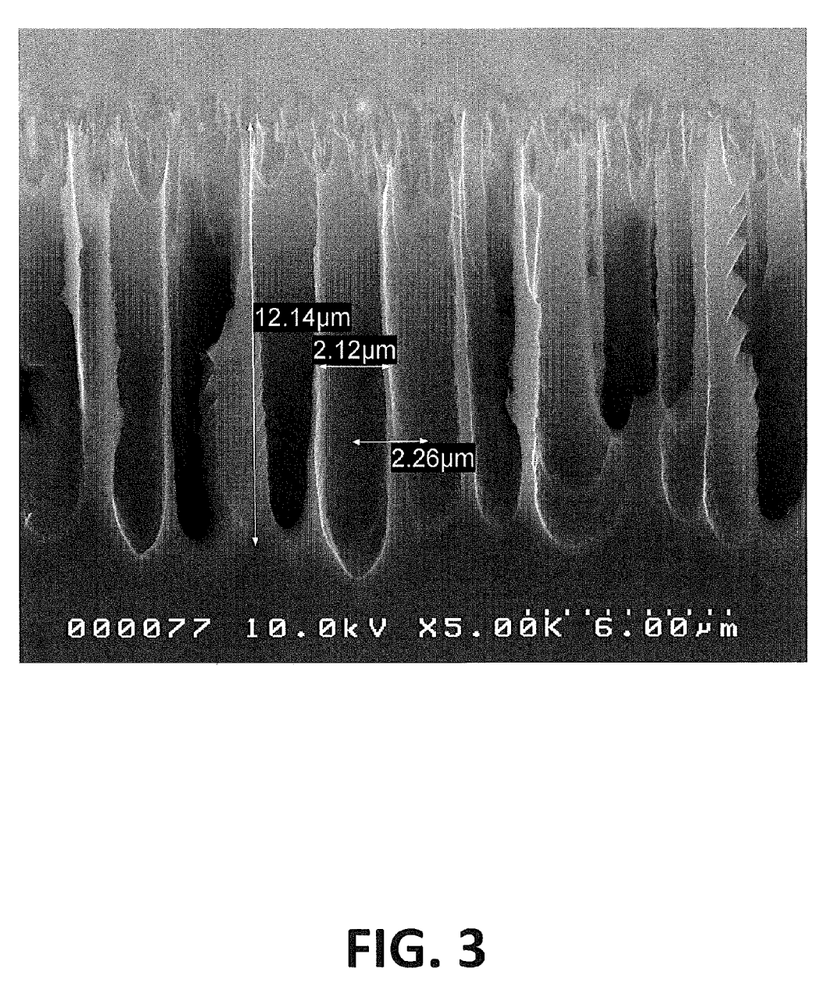
FIG. 3 illustrates pores of the substrates of a solid state device after electrochemical processing according to an embodiment of the application.

As shown in FIG. 3, a porous silicon substrate 110 is formed using the above-mentioned electrochemical processing technique. The porous silicon substrates 110 therefore can be formed of controlled pore sizes using low-cost techniques. The controlled technique also achieves a high density of small diameter holes related to improved detection efficiencies of the solid state detection device.

Generally, the pores formed in the substrate 110 have a height of about 10-50 microns. Preferably, the height is about 10-30 microns. The pores have a diameter of about 0.1-2 microns. Preferably, the diameter is about 2-3 microns. Moreover, the pore density of the substrate ranges from about 1-10 pores per square micron. Preferably, the pore density of the substrate is about 1-5 pores per square micron. Even further, the pore density of the substrate is about 1-3 pores per square micron.

Figure 4A:
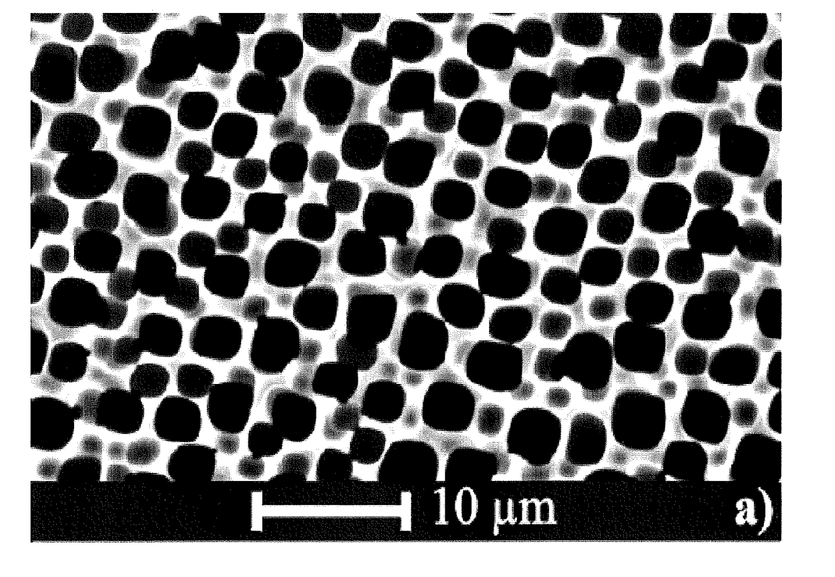
FIGS. 4A-B illustrate magnified views of the pores of the substrate according to an embodiment of the present application.
Figure 4B:
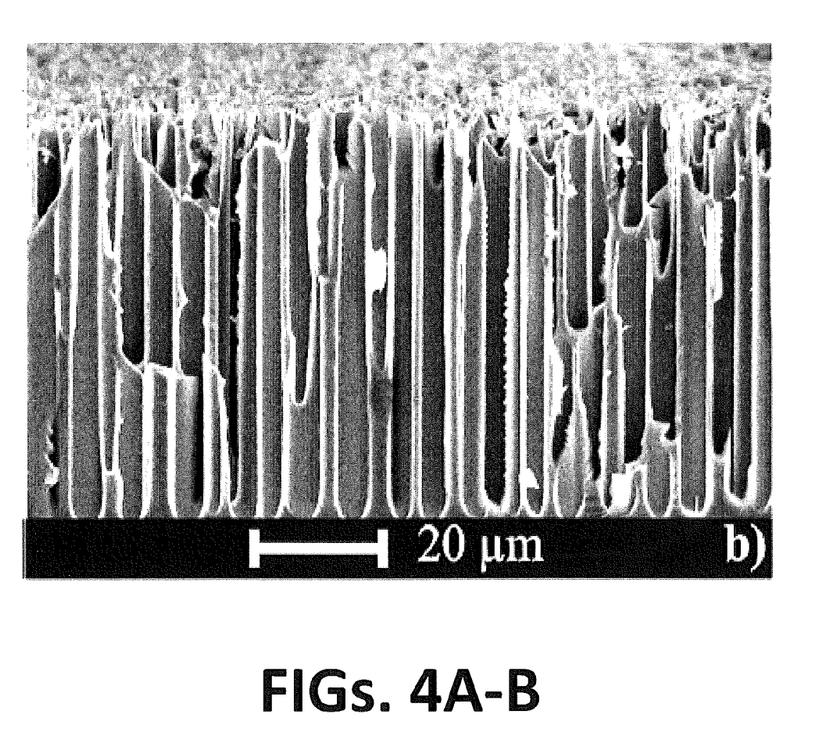

As shown in FIGS. 4A-B, the silicon substrate prepared in an organic solution includes macropores. In FIG. 4A, the number of pores is shown along a length of 10 microns. Meanwhile, as shown in FIG. 4B, the number of pores are provided along a length of 20 microns.

Figure 5A:
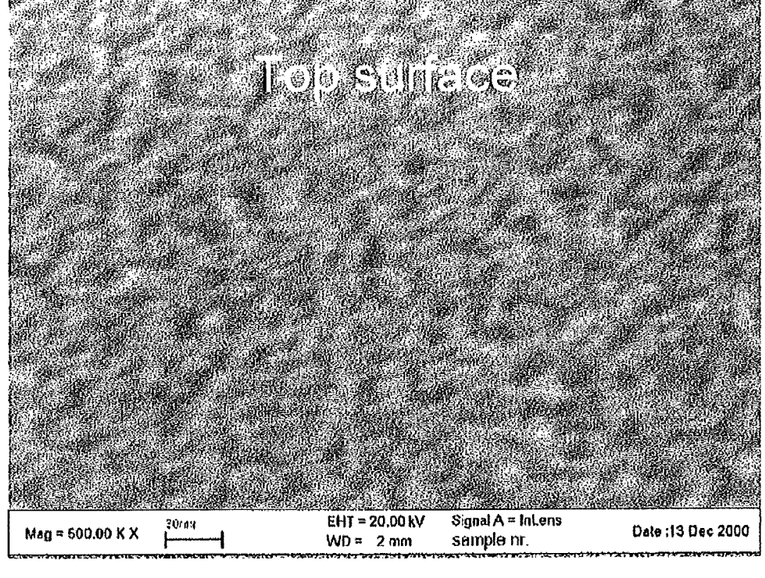
FIGS. 5A-B illustrate top surface and cross-sectional views of the solid state device according to an embodiment of the present application.
Figure 5B:
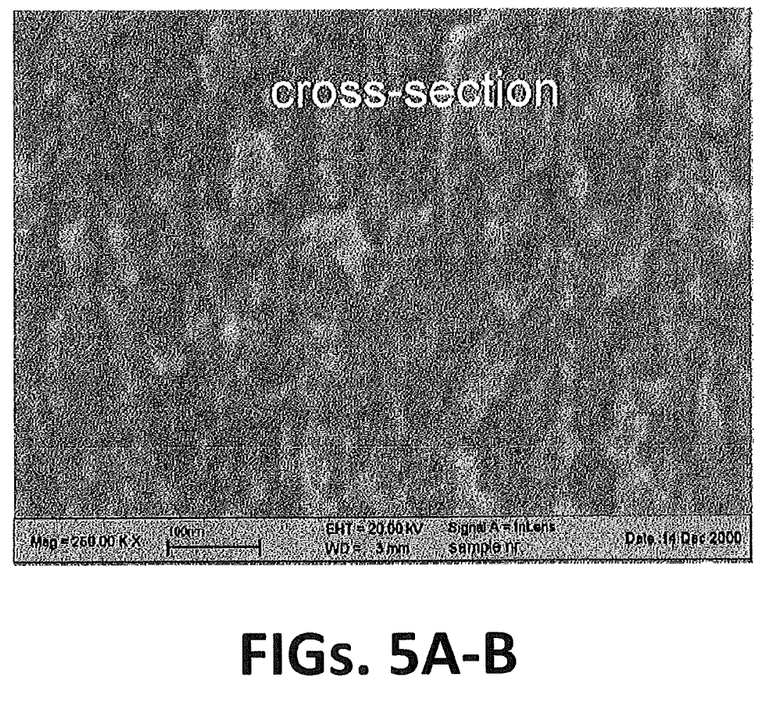

As illustrated in FIGS. 5A-B, a top surface view and cross-sectional view of the silicon substrate with a 30 micron porous layer is illustrated. The views are taken by a scanning electron microscope. In the top view shown in FIG. 5A, the horizontal bar indicates a scale of 50 nm. Meanwhile in the cross-sectional view shown in FIG. 5B, the horizontal bar indicates a scale of 100 nm. Moreover, the porosity is about 60% as illustrated. It is envisaged according to this application that varying porosities can be prepared to varying depths in the substrate by changing the electrochemical processing conditions.

According to another embodiment, and referring to FIG. 1 described above, the device 100 includes a doping layer 120. The doping layer generally is applied via gaseous diffusion into the columnar-like pores. The doping layer 120 is applied onto a layer of the pores of the substrate 110. In an exemplary embodiment, the doping layer 120 may be 0.1-1 microns in thickness. In a further exemplary embodiment, the thickness of the doping layer is about 0.25.

The doping layer 120 may be made of p- or n-type dopants. If the dopant is n-type, as illustrated in FIG. 1, it should be a Group V element. Preferably, the n-type dopant is selected from Arsenic, Phosphorous and combinations thereof. Alternatively, if the dopant is p-type, it should be selected from a Group III element. Preferably, the p-type dopant is selected from Boron, Gallium and Aluminum, combinations thereof. Accordingly, the substrate 110 and doping layer 120 form a PN junction.

In another embodiment, the device 100 includes a fill material 130 deposited in the pores of the substrate 110. More particularly, the fill material 130 is deposited over the doping layer. Generally, the fill material 130 is a neutron capturing material which may be selected from Boron trioxide, Gadolinium, Lithium and combinations thereof. The thickness of the filler material 130 is sufficient to encapsulate the pores in the substrate 110. Filling the pore junctions with a fill material, such as those materials disclosed above, effectively sensitizes the junctions to incident neutrons. By so doing, the device 100 has an extremely high effective sensing area.

According to the application, the fill material 130 is preferably deposited in a liquid phase. Employing a liquid phase deposition technique as realized in this application to fill the pore at least has the advantage of allowing a complete fill of the pores since the liquid can flow into them. Another advantage for the liquid phase deposition technique is that the liquid can flow freely to the bottom of the pores without obstructing the pore opening. In particular, obstruction of the pore openings is a common drawback when conventional gaseous phase techniques are employed. In an exemplary embodiment, the fill material is deposited in a sol-gel process using an alkoxide. For example, the sol gel process generally employs a homogenous solution of one or more selected alkoxides. Alkoxides may include but are not limited to tetraethyl orthosilicate (TEOS), trimethyl borate, aluminum sec-butoxide, titanium isopropoxide, and zirconium isopropoxide. The homogenous solution reacts to a point where the molecular structure is no longer reversible, e.g., sol gel transition point. The reaction rate may depend upon pH, concentration and solvent employed.

In a further embodiment, the device 100 is connected via electrical contacts 140 to an electrical detection circuit 150. The detection circuit 150 may include a transistor for monitoring current flowing therethrough. The detection circuit 150 employed in this application is similar to that disclosed in *Perforated Semiconductor Neutron Modules for Detection of Spontaneous Fission Neutrons*, McGregor, Douglas S, et al., SMART Laboratories, Mechanical and Nuclear Engineering, Kansas State University, 2007, and is incorporated by reference. As described in McGregor et al., the detectors are produced as Si pin diodes. The detectors have 30 micron diameter holes that are generally about 20-100 microns deep. The detectors have an insulating coating inside the holes. The active area of the detector is 25 $mm^2$. The detectors generally operate on minimal voltage of about 2.7 to 5 volts at 150 micro-Amperes. The detectors may include a preamplifier/amplifier, power supply and digital display.

According to another aspect of the application, a method is disclosed for assessing the neutron detection efficiency for the solid state device. The Monte Carlo method was employed to calculate the detection efficiency. The Monte Carlo method incudes a broad class of computational algorithms that rely on repeated random sampling to obtain numerical results. A simulation for the Monte Carlo assessment of ion energy depositions employed in this application was adopted from *Efficiencies of Coated and Perforated Semiconductor Neutron Detectors*, Shultis, Kenneth J., and McGregor, Douglas S., IEEE Transactions on Nuclear Science, Vol. 53, no. 3, June 2006, and is incorporated in its entirety by reference.

In Monte Carlo simulations, a plane parallel beam uniformly and normally illuminates the top or bottom of the detector. The semiconductor is assumed to be transparent to these neutrons and the total cross section for the fill layer is taken as the ion-producing cross-section. Neutron scattering effects are not considered.

By uniformly sampling over the illuminated surface of the detector, a random point for a neutron incident on the detector surface is determined. Then along a ray through this entry point, a random depth for a neutron interaction in the fill material is obtained by sampling from the distribution $f(z)=C \exp(-\Sigma^* z)$ where $\Sigma$ is the thermal averaged macroscopic cross-section for ion production in the fill material. Here, $C=[1-\exp(\Sigma^* T)]^{-1}$ is a normalization constant to make $f(z)$ a properly normalized probability distribution function. The depth T is the length of the ray through the fill material. If no fill material is in the path of the neutron ray then the neutron passes through the detector without interaction. Once a random interaction site is determined, a random direction for one of the ions is selected from an isotropic direction distribution. The other reaction ion is given the opposite direction. The identities of the ions are then randomly selected according to the branching ratio of various ions produced in the neutron interaction. The two above-mentioned ions are tracked along their paths in the detector.

Next, the energy transferred to the silicon regions is calculated. Here, the energy deposited in the silicon by each simulated ion history is then found by calculating the energy lost by the ion over every path segment it travels through the silicon. The energy that the two reaction ions deposit in the silicon regions along their tracks is then recorded in an appropriate bin or tally vector for each simulated reaction event. After performing this simulation for several million reactions, an ideal energy-deposition spectrum in obtained.

Further, the detection efficiency may be defined as the fraction of all thermal neutrons incident on the detector that interact in the fill material and whose subsequent ions deposit at least some minimal amount of energy in the silicon substrate of the detector device. In an exemplary embodiment, the energy is deposited at or in a pore surface of the substrate. In this analysis, a single tally bin was used to record such interactions, thereby allowing the detector efficiency to be estimated without having to sum the simulated spectra to determine the number of histories depositing energy exceeding the cutoff energy, $E_{cut}$, in the silicon. This number divided by the total number of histories gives the detector efficiency.

In the above-mentioned Shultis paper, the calculated thermal neutron detection efficiencies are found by at least initially selecting a hole diameter and cell dimension. The cell diameter is divided by the hole diameter to determine the hole-diameter fraction. In Shultis, a cell dimension of 10 microns with 6 micron diameter holes results in a hole fraction of 0.6. As such, the expected efficiency is 16%. This means that 16% of thermal neutrons crossing the plane of the perforated device will be detected.

Contrary to Shultis, and in accordance with embodiments of this application, the solid state device realizes a detection efficiency greater than 40%. In another embodiment, the detection efficiency is greater than 50%. In yet another embodiment, the detection efficiency is greater than 55%. In yet even another embodiment, the detection efficiency is greater than 60%. In a further embodiment, the detection efficiency ranges from about 40 to 70%. Preferably the detection efficiency is about 40 to 60%.

According to the application, the detection efficiency may at least be related to the fabrication of smaller hole diameters and hole-to-hole distances in the present application. For example, the realized hole diameter is about 2.1 microns and the hole-to-hole distance is about 2.25 microns as discussed above and illustrated in FIG. 3.

Figure 6:
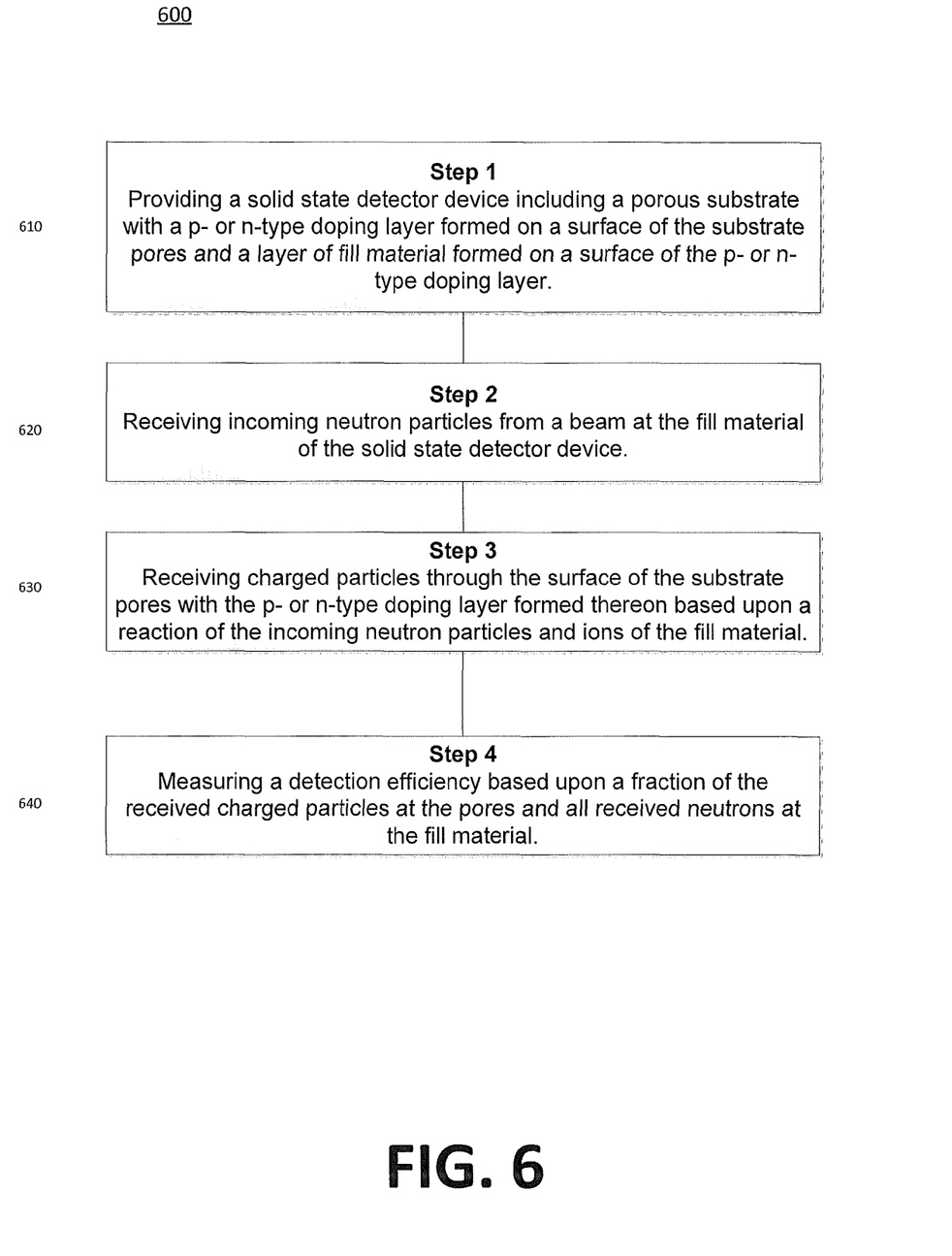
FIG. 6 illustrates a flow diagram of a method of detecting neutron efficiency of the solid stated device according to an embodiment of the present application.

According to even a further aspect of the invention, there is disclosed a method 600 of detecting efficiency of a solid state detector device. The method includes the step of providing the solid state detector device including a porous substrate with a p- or n-type doping layer formed on a surface of the substrate pores (Step 1). Moreover, a layer of fill material is formed on a surface of the p- or n-type doping layer. The method also includes the step of receiving incoming neutron particles from a beam at the fill material of the solid state detector device (Step 2). The method also includes a step of receiving charged particles through the surface of the substrate pores with the p- or n-type doping layer formed thereon based upon a reaction of the incoming neutron particles and ions of the fill material (Step 3). The method further includes the step of measuring a detection efficiency based upon a fraction or ratio of the received charged particles at the pores and all received neutrons at the fill material (Step 4). According to an embodiment, the detector efficiency is greater than about 40%. In another embodiment, the detector efficiency of the device is greater than about 40% and less than about 70%.

While the apparatus, system and methods have been described in terms of what are presently considered to be specific aspects, the disclosure need not be limited to the disclosed aspects. It is intended to cover various modifications and similar arrangements included within the spirit and scope of the claims, the scope of which should be accorded the broadest interpretation so as to encompass all such modifications and similar structures. The present disclosure includes any and all aspects of the following claims.

What is claimed is:

1. A method of making a solid state device for detecting neutrons comprising:
   providing a bulk semiconductor substrate;
   electrochemically processing the substrate in an organic bath for a predetermined time period to form pores in the substrate; and
   filling the pores in a liquid phase using a sol-gel technique with a fill material that reacts with neutrons,
   wherein the pores and the fill material have varying depths in the substrate.

2. The method of claim 1, further comprising:
   doping a surface of the pores via gaseous diffusion with a p- or n-type impurity prior to the filling step.

3. The method of claim 2, wherein the p- or n-type impurity is selected from a Group III or a Group V element.

4. The method of claim 1, wherein the organic bath includes about a 20% or greater HF solution.

5. The method of claim 1, wherein the predetermined time period for processing ranges from about 15 to 45 minutes.

6. The method of claim 1, wherein the substrate is selected from Silicon, Geranium, Gallium, Arsenide and combinations thereof.

7. The method of claim 1, wherein the fill material is trimethyl borate.

8. The method of claim 1, wherein the step of electrochemical processing operates at a current density ranging from about 1 to 2 $mA/cm^2$.

9. A solid state neutron detection device comprising:
   a semiconductor substrate having pores;
   a p- or n-type doping layer formed on a surface of the substrate pores; and
   a layer of fill material formed on the p- or n-type doping layer in a liquid phase using a sol-gel technique,
   wherein a neutron detection efficiency of the device, based upon a ratio of charged particles received at the surface of the substrate pores originating from neutron particles incident on the layer of fill material and transmitted therethrough, is greater than about 40%,
   wherein the pores and the fill material have varying depths in the substrate.

10. The device of claim 9, wherein the height of the pores is about 10-50 microns.

11. The device of claim 10, wherein the height of the pores is about 20-40 microns.

12. The device of claim 9, wherein the diameter of the pores is about 0.1-2 microns.

13. The device of claim 9, wherein the pore density of the substrate is about 1-10 pores per square micron.

14. The device of claim 9, wherein the thickness of the doping layer is about 0.05-0.5 microns.

15. The device of claim 9, wherein the substrate is selected from Silicon, Geranium, Gallium, Arsenide and combinations thereof.

16. The device of claim 9, wherein the fill is trimethyl borate, Gadolinium, Lithium and combinations thereof.

17. The device of claim 9, wherein the donor impurity is selected from a Group III or V element.

18. A method of detecting efficiency of a solid state detector device comprising:
   providing the solid state detector device including a porous substrate with a p- or n-type doping layer formed on a surface of the substrate pores and a layer of fill material formed on a surface of the p- or n-type doping layer in a liquid phase using a sol-gel technique;

receiving neutron particles from a beam at the layer of fill material;

reacting the received neutron particles and ions of the layer of fill material; and measuring a detection efficiency based upon a fraction of charged particles at the surface of the substrate pores originating from the neutron particles received at the layer of fill material, wherein the pores and the fill material have varying depths in the substrate.

19. The method of claim 18, wherein the detection efficiency is greater than about 40%.

20. The method of claim 19, wherein the detection efficiency is less than about 70%.

* * * * *